United States Patent
Wang et al.

(10) Patent No.: US 12,495,522 B2
(45) Date of Patent: Dec. 9, 2025

(54) UTILIZATION OF INTERCONNECTIONS IN ELECTRONIC CIRCUITS AS MAGNETOHYDRODYNAMIC PUMPS FOR LIQUID METAL BASED COOLING

(71) Applicant: Ohio State Innovation Foundation, Columbus, OH (US)

(72) Inventors: Jin Wang, Columbus, OH (US); Junchong Fan, Columbus, OH (US)

(73) Assignee: Ohio State Innovation Foundation, Columbus, OH (US)

(*) Notice: Subject to any disclaimer, the term of this patent is extended or adjusted under 35 U.S.C. 154(b) by 244 days.

(21) Appl. No.: 18/195,415

(22) Filed: May 10, 2023

(65) Prior Publication Data
US 2023/0371203 A1   Nov. 16, 2023

Related U.S. Application Data

(60) Provisional application No. 63/340,093, filed on May 10, 2022.

(51) Int. Cl.
H02K 44/02 (2006.01)
H05K 7/20 (2006.01)
F28F 23/00 (2006.01)

(52) U.S. Cl.
CPC ......... *H05K 7/20327* (2013.01); *H02K 44/02* (2013.01); *F28F 23/00* (2013.01)

(58) Field of Classification Search
CPC ......... H02K 44/04; H02K 44/02; F28F 23/00; H05K 7/20327
See application file for complete search history.

(56) References Cited

U.S. PATENT DOCUMENTS

| | | | |
|---|---|---|---|
| 7,295,435 B2 * | 11/2007 | Ouyang | H01L 23/473 361/689 |
| 9,397,544 B2 * | 7/2016 | Fujishima | H02K 7/025 |
| 2009/0279259 A1 * | 11/2009 | Cripe | H05K 7/20254 361/699 |

OTHER PUBLICATIONS

Kassakian, John G., and Thomas M. Jahns. "Evolving and emerging applications of power electronics in systems." IEEE Journal of Emerging and Selected Topics in Power Electronics 1.2 (2013): 47-58.

* cited by examiner

*Primary Examiner* — Ana M Vazquez
(74) *Attorney, Agent, or Firm* — Meunier Carlin & Curfman LLC

(57) ABSTRACT

An Interconnection integrated MHD pump is used in a liquid metal cooling system to provide a pump to the liquid metal by induced magnetic field and may be connected to main electrical systems of the cooling system for providing the magnetic field. The liquid metal cooling system includes an MHD pump, cooling pad, a radiator, and a fluidic channel. The MHD pump comprises a magnet on at least one side of one of the fluidic channel.

11 Claims, 4 Drawing Sheets

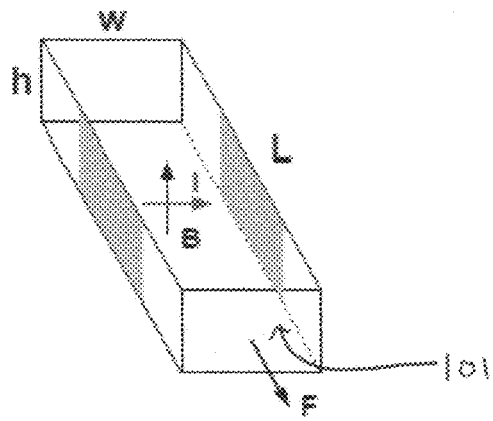
Fig. 1: Vector diagram of Lorentz force
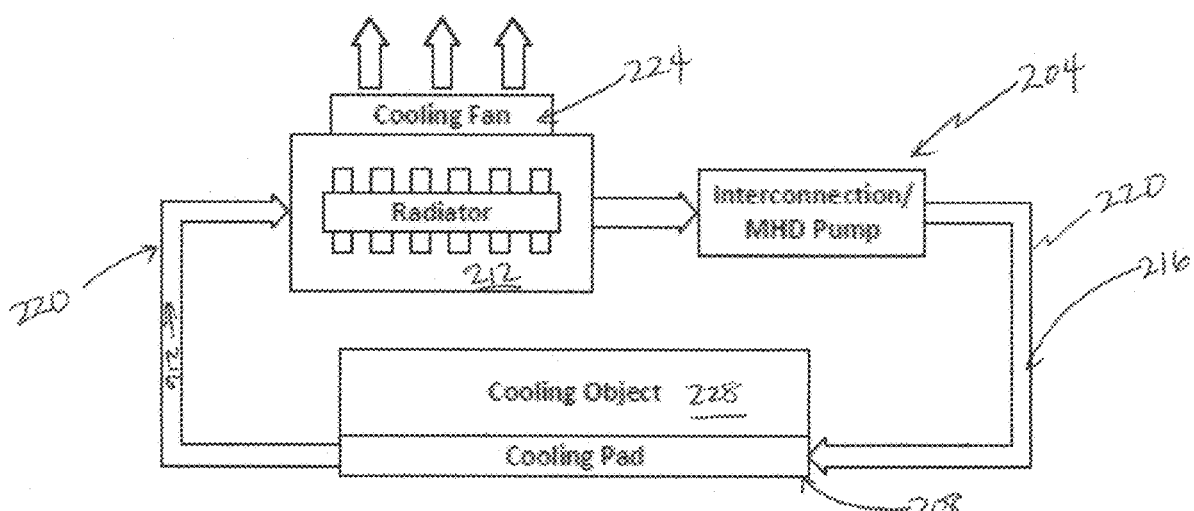
Fig. 2: Liquid metal cooling system

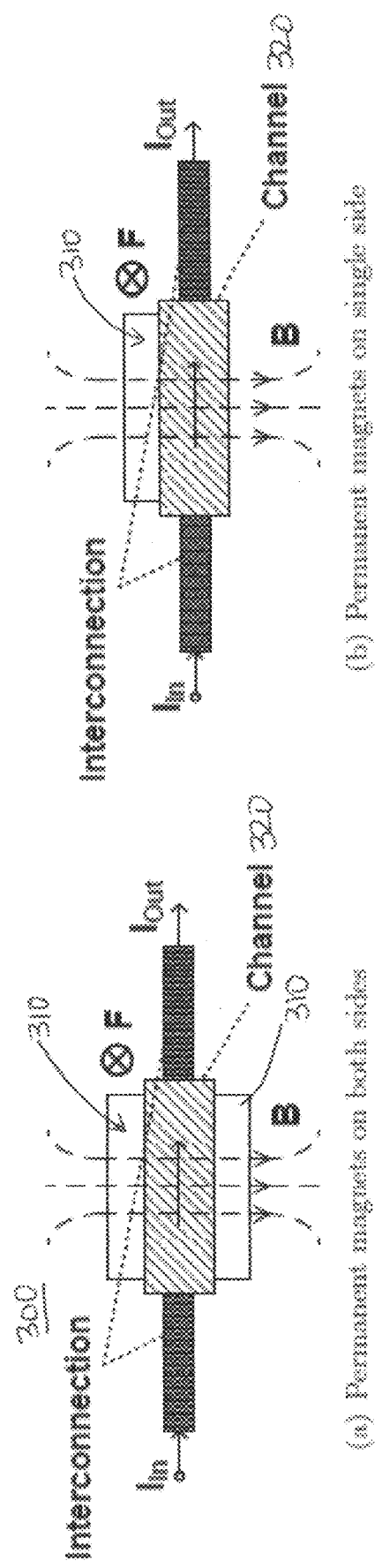
Fig. 3: Interconnection integrated MHD pump structure with permanent magnets
(a) Permanent magnets on both sides
(b) Permanent magnets on single side

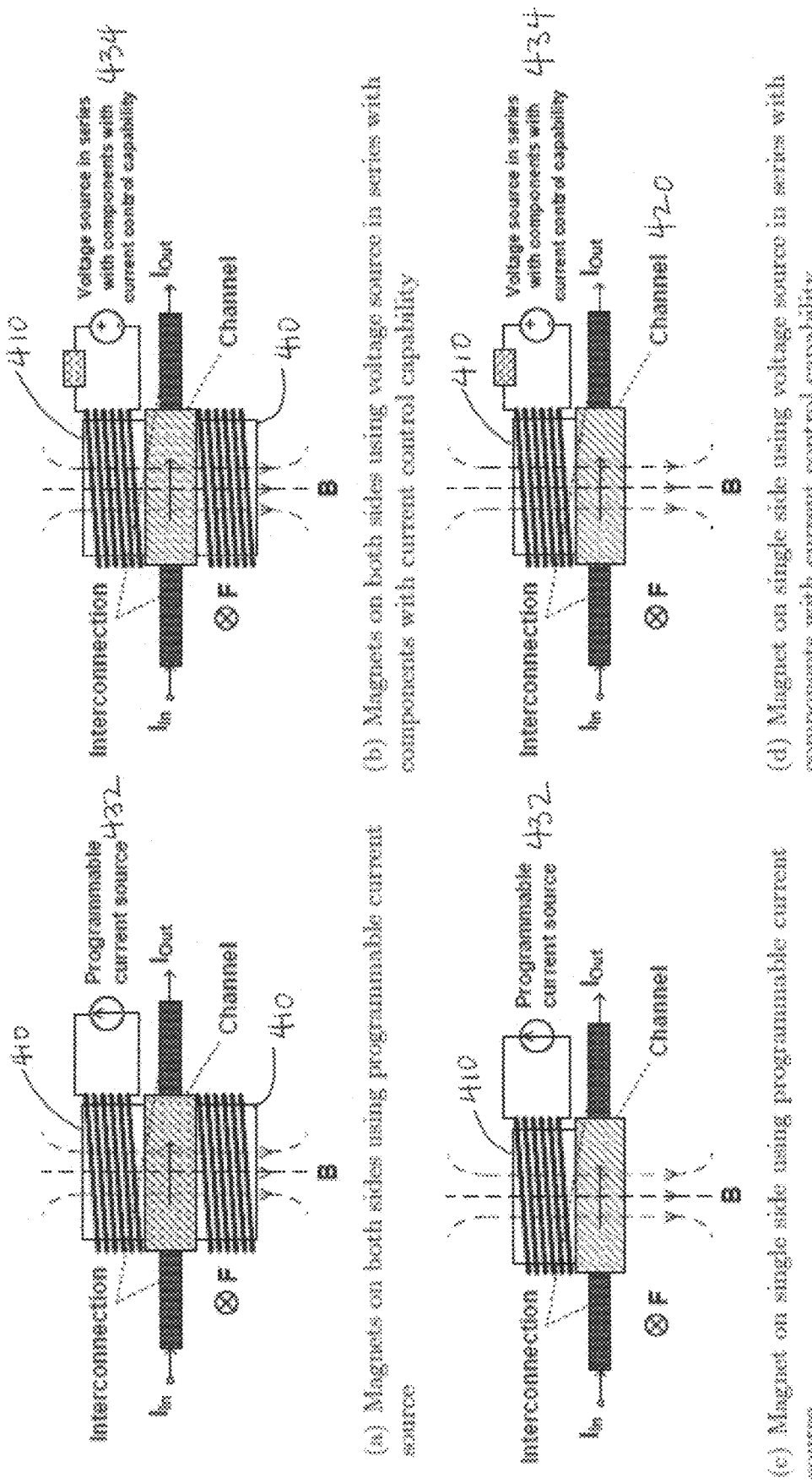
Fig. 4: Interconnection integrated MHD pump structure with induced magnetic field

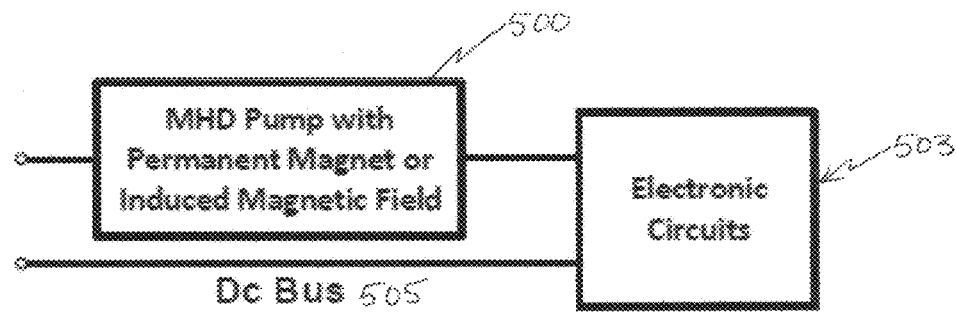
Fig. 5: Interconnection integrated MHD pump structure applied in dc bus
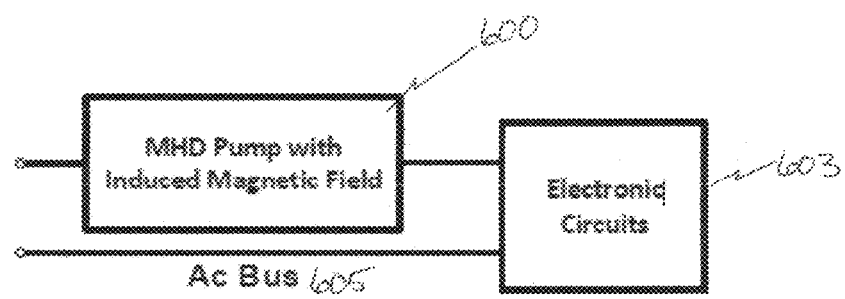
Fig. 6: Interconnection integrated MHD pump structure applied in ac bus

UTILIZATION OF INTERCONNECTIONS IN ELECTRONIC CIRCUITS AS MAGNETOHYDRODYNAMIC PUMPS FOR LIQUID METAL BASED COOLING

ACKNOWLEDGEMENTS

This invention was made with government support under grant/contract numbers DE-AC05-00OR22725 and DE-EE0008709 awarded by the Department of Energy. The government has certain rights in the invention.

BACKGROUND

Liquid cooling system offers benefits over air cooling system in terms of cooling efficiency and thermal dissipation ability. Potential areas which are suitable for the liquid cooling system include electric vehicles, large-scale data centers, high power density converters, new generation power modules, and aerospace applications. The aforementioned applications require high stability and reliability, while simultaneously, high power density designs and packages face severe thermal dissipation issues due to confined space. Liquid cooling in these applications will provide higher thermal performance and guarantee stability. As the capacity of electric vehicles and the information industry escalates, developing new generation semiconductor devices and power modules with innovative liquid cooling strategies are effective methods to improve the performance of power converters.

A major impediment to the liquid cooling system has been the existence of the mechanical pump which reduces the overall reliability of the system. Also, the thermal conductivity of conventional coolants like water is limited, which lowers the heat exchange efficiency between thermal pad and coolant.

BRIEF SUMMARY OF THE DISCLOSURE

Accordingly, the present invention is directed to interconnections in electronic circuits as Magnetohydrodynamic (MHD) Pumps for liquid metal that obviates one or more of the problems due to limitations and disadvantages of the related art.

In accordance with the purpose(s) of this invention, as embodied and broadly described herein, this invention, in one aspect, relates to a Magnetohydrodynamic (MHD) Pump for a Liquid Metal based Cooling system, that includes a magnet on at least one side of one of a fluidic channel in the liquid-metal based cooling system.

In another aspect, the invention relates to the liquid metal cooling system including an MHD pump; cooling pad, a radiator a first fluidic channel between the radiator and the cooling pad and a second fluidic channel between the cooling pad and the radiator. The MHD pump comprises a magnet on at least one side of one of the first fluidic channel or the second fluidic channel.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

An advantage of the present invention is to provide interconnections in electronic circuits as Magnetohydrodynamic (MHD) Pumps for liquid metal-based cooling.

Further embodiments, features, and advantages of the interconnections in electronic circuits as Magnetohydrodynamic (MHD) Pumps for liquid metal-based cooling, as well as the structure and operation of the various embodiments of the interconnections in electronic circuits as Magnetohydrodynamic (MHD) Pumps for liquid metal-based cooling, are described in detail below with reference to the accompanying drawings.

It is to be understood that both the foregoing general description and the following detailed description are exemplary and explanatory only, and are not restrictive of the invention as claimed.

BRIEF DESCRIPTION OF THE DRAWINGS

Example features and implementations are disclosed in the accompanying drawings. However, the present disclosure is not limited to the precise arrangements and instrumentalities shown. The accompanying figures, which are incorporated herein and form part of the specification, illustrate interconnections in electronic circuits as Magnetohydrodynamic (MHD) Pumps for liquid metal-based cooling according to principles described herein. Together with the description, the figures further serve to explain the principles of the electronic circuits as Magnetohydrodynamic (MHD) Pumps for liquid metal-based cooling described herein and thereby enable a person skilled in the pertinent art to make and use the electronic circuits as Magnetohydrodynamic (MHD) Pumps for liquid metal-based cooling.

FIG. 1 is a vector diagram of and MHD pump used in liquid metal nuclear reactor cooling systems according to principles described herein.

FIG. 2 illustrates components of an Magnetohydrodynamic (MHD) Pump system for liquid metal-based cooling according to principles described herein.

FIG. 3 illustrates an example interconnection integrated MHD pump structure and operation with permanent magnets according to principles described herein.

FIG. 4 illustrates an example interconnection integrated MHD pump structure and operation with an induced magnetic field according to principles described herein.

FIG. 5 illustrates an example interconnection integrated MHD pump structure applied in a dc bus system.

FIG. 6 illustrates an example interconnection integrated MHD pump structure applied in an ac bus system.

DETAILED DESCRIPTION

Reference will now be made in detail to embodiments of the vascular graft with an interchangeable inner lumen with reference to the accompanying figures. The same reference numbers in different drawings may identify the same or similar elements.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The existing solutions include: 1) High thermal conductivity coolant. 2) Magnetohydrodynamic (MHD) pump system.

High thermal conductivity coolant is still driven by a conventional mechanical pump. To eliminate moving parts, improve overall reliability and improve cooling performance, an MHD pump together with liquid metal coolant may provide benefits.

MHD pump systems utilize the Lorentz force to drive conductive liquid metal coolant. Permanent magnets or induced magnetic field are used to provide a perpendicular magnetic field.

As an example, FIG. 1 shows the vector-diagram of an MHD pump for use in liquid metal nuclear reactor cooling systems and micropump systems. The Lorentz force F is produced when an electric current I is applied across a channel 101 filled with conducting coolant (not shown) in the presence of a perpendicular magnetic field B. Permanent magnets (not shown) or induced magnetic field (not shown) provide the magnetic field B needed in the pump. However, in conventional MHD pump systems, a set of auxiliary power supply is needed to provide the current flowing I through the conductive liquid. This adds cost and complexity and could potentially reduce system power density and reliability.

Accordingly, described herein is a liquid metal cooling system configuration to address various aspects of existing systems. The proposed interconnection integrated MHD pump is applied in the liquid metal cooling system. As illustrated in FIG. 2, an embodiment of the system 200 includes three parts: MHD pump 204, cooling pad 208, and radiator 212. Conductive liquid metal coolant 216 in the flow channel 220 carries heat from the cooling pad 208 to the radiator 212. The radiator 212 may further comprise a cooling fan 224 to remove heat from the radiator 212. The object to be cooled (cooling object 228) may be adjacent to the cooling pad 208 for thermal transfer.

An interconnection integrated MHD pump and operation principles and structures thereof are described with respect to FIGS. 3 and 4. The illustrated interconnection integrated MHD pump utilizes the current flow from main power electronic circuits (not shown), thus eliminating a set of auxiliary power supply/supplies as in conventional devices that provide(s) the pumping current. A magnetic field B is provided by permanent magnets 310 or induced magnetic field (FIG. 4). The Lorentz force generated by the perpendicular magnetic field B and current I will push liquid metal in the flow channel 320 in one direction. Flow rate is automatically adjusted by the load condition, the higher the power handled by the power converter, the higher the flow rate.

Exemplary structures of interconnection integrated MHD pump are shown in FIGS. 3 to FIG. 4. Magnetic components 310/410 can be configured on both sides of the liquid metal channel 320/420 or only on one side of the channel 320/420. Both programmable current source 432 and voltage source 434 in series with components with current control capability (e.g., varistor) can be used as the auxiliary power supply to generate the induced magnetic field B.

Potential application topologies are shown in FIG. 5.

In electronic circuits 503 having a dc bus 505, the current flow direction in the dc bus may be constant, e.g., the input bus of the buck circuit. In an example case of dc bus, the integrated MHD pump 500 can be configured with permanent magnets or induced magnetic field as illustrated in FIG. 5. In electronic circuits 603 having an ac bus 605, the current flow direction in ac bus 605 is alternating, e.g., the output bus of the inverter. In the example case of an ac bus, the integrated MHD pump 600 should be configured with induced magnetic field in order to keep the flow direction of the liquid metal coolant constant, as illustrated in FIG. 6.

In an example, a liquid metal cooling system according to principles described herein includes an MHD pump; cooling pad, a radiator, a first fluidic channel between the radiator and the cooling pad and a second fluidic channel between the cooling pad and the radiator, wherein the MHD pump comprises a magnet on at least one side of one of the first fluidic channel or the second fluidic channel.

The liquid metal cooling system may further include a magnet on an opposite side of the first fluidic channel or the second fluidic channel.

The magnet may be a permanent magnet.

The magnet may be an electromagnet.

The electromagnet further may be a programmable current source.

The electromagnet further may be a voltage source in series with components with current control capability.

The liquid metal cooling system may further include a liquid metal in the first fluidic channel and the second fluidic channel.

The MHD pump may be connected to a main power electronic circuit of the liquid metal cooling system to provide current to form an electromagnet to induce the magnetic field to cause coolant flow.

The MHD pump may be connected via electronic circuits to a current bus.

The current bus may be a DC current bus and the MHD pump may include either a permanent magnet or an electromagnet.

The current bus may be a AC current bus and the MHD pump may include an electromagnet.

An example Magnetohydrodynamic (MHD) Pump for a Liquid Metal based Cooling system may include the MHD pump comprising a magnet on at least one side of one of a fluidic channel in the liquid-metal based cooling system.

The liquid metal based cooling system may include as second fluidic channel.

The MHD pump may include a magnet on an opposite side of the first fluidic channel or the second fluidic channel.

The magnet may be a permanent magnet.

The magnet may be an electromagnet.

The electromagnet further may include a programmable current source.

The electromagnet may include a voltage source in series with components with current control capability.

The MHD pump may include a liquid metal in the first fluidic channel and the second fluidic channel.

The magnet may be connected to a main power electronic circuit of the liquid metal cooling system.

The magnet may be connected via electronic circuits to a current bus.

The current bus may be a DC current bus and the MHD pump may be either a permanent magnet or an electromagnet.

The current bus may be an AC current bus and the MHD pump may be an electromagnet.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

Disclosure of J. G. Kassakian and T. M. Jahns, "Evolving and emerging applications of power electronics in systems," IEEE Journal of Emerging and Selected Topics in Power Electronics, vol. 1, no. 2, pp. 47-58, 2013 is hereby incorporated by reference in its entirety into this application in order to more fully describe the state of the art to which this invention pertains.

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

What is claimed is:

1. A liquid metal cooling system, comprising:
the liquid metal cooling system including an MHD pump; cooling pad, a radiator, and a first fluidic channel between the radiator and the cooling pad and a second fluidic channel between the cooling pad and the radiator,
wherein the MHD pump comprises a magnet on at least one side of a segment of the first fluidic channel or the second fluidic channel, wherein the MHD pump is connected via electronic circuits to a current bus, wherein the current bus is an AC current bus and the magnet comprises an electromagnet, and further wherein the MHD pump receives AC current through the AC current bus from a main power electric circuit of the system and not from an auxiliary power supply for the MHD pump.

2. The liquid metal cooling system of claim 1, further comprising a magnet on an opposite side of a segment of the first fluidic channel or the second fluidic channel.

3. The liquid metal cooling system of claim 1, wherein the electromagnet further comprises a programmable current source.

4. The liquid metal cooling system of claim 1, wherein the electromagnet further comprises a voltage source in series with components with current control capability.

5. The liquid metal cooling system of claim 1, further comprising a liquid metal in the first fluidic channel and the second fluidic channel.

6. The liquid metal cooling system of claim 1, wherein the MHD pump is a segment of an electrical connection of a circuit that is to be cooled.

7. A Magnetohydrodynamic (MHD) Pump for a Liquid Metal based Cooling system, the MHD pump comprising a magnet on at least one side of one of a fluidic channel in the liquid-metal based cooling system, wherein the MHD pump is connected via electronic circuits to a current bus, wherein the current bus is an AC current bus and the magnet comprises an electromagnet, and further wherein the MHD pump receives AC current through the AC current bus from a main power electric circuit of the system and not from an auxiliary power supply for the MHD pump.

8. The MHD pump of claim 7, further comprising a magnet on an opposite side of the first fluidic channel or a second fluidic channel.

9. The MHD pump of claim 8, further comprising a liquid metal in the first fluidic channel and the second fluidic channel.

10. The MHD pump of claim 7, wherein the electromagnet further comprises a programmable current source.

11. The MHD pump of claim 7, wherein the electromagnet further comprises a voltage source in series with components with current control capability.

* * * * *